(12) United States Patent
Lin et al.

(10) Patent No.: US 11,450,612 B2
(45) Date of Patent: Sep. 20, 2022

(54) SEMICONDUCTOR DEVICES AND METHODS OF MANUFACTURING THE SAME

(71) Applicant: Taiwan Semiconductor Manufacturing Co., Ltd., Hsinchu (TW)

(72) Inventors: Yu-Hung Lin, Taichung (TW); An-Jhih Su, Taoyuan (TW); Der-Chyang Yeh, Hsin-Chu (TW); Shih-Guo Shen, New Taipei (TW); Chia-Nan Yuan, Hsinchu (TW); Ming-Shih Yeh, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/924,201

(22) Filed: Jul. 9, 2020

(65) Prior Publication Data

US 2022/0013461 A1    Jan. 13, 2022

(51) Int. Cl.

| | |
|---|---|
| *H01L 23/538* | (2006.01) |
| *H01L 23/31* | (2006.01) |
| *H01L 21/48* | (2006.01) |
| *H01L 25/00* | (2006.01) |
| *H01L 25/065* | (2006.01) |

(52) U.S. Cl.
CPC ........ *H01L 23/5381* (2013.01); *H01L 21/486* (2013.01); *H01L 21/4853* (2013.01); *H01L 21/4857* (2013.01); *H01L 23/3128* (2013.01); *H01L 23/5383* (2013.01); *H01L 23/5384* (2013.01); *H01L 25/0655* (2013.01); *H01L 25/50* (2013.01)

(58) Field of Classification Search
CPC ............. H01L 23/5381; H01L 21/4853; H01L 21/4857
See application file for complete search history.

(56) References Cited

U.S. PATENT DOCUMENTS

| | | | |
|---|---|---|---|
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |

(Continued)

*Primary Examiner* — Errol V Fernandes
(74) *Attorney, Agent, or Firm* — JCIPRNET

(57) ABSTRACT

A semiconductor device includes a bridge and a plurality of dies. The bridge is free of active devices and includes a substrate, an interconnect structure, a redistribution layer structure and a plurality of conductive connectors. The interconnect structure includes at least one dielectric layer and a plurality of first conductive features in the at least one dielectric layer. The redistribution layer structure includes at least one polymer layer and a plurality of second conductive features in the at least one polymer layer, wherein a sidewall of the interconnect structure is substantially flush with a sidewall of the redistribution layer structure. The conductive connectors are electrically connected to one another by the redistribution layer structure and the interconnect structure. The bridge electrically connects the plurality of dies.

14 Claims, 11 Drawing Sheets

(56) References Cited

U.S. PATENT DOCUMENTS

| | | |
|---|---|---|
| 9,496,189 B2 | 11/2016 | Yu et al. |
| 9,666,502 B2 | 5/2017 | Chen et al. |
| 9,735,131 B2 | 8/2017 | Su et al. |
| 2020/0035603 A1* | 1/2020 | Rubin .................... H01L 23/04 |
| 2020/0176393 A1* | 6/2020 | Ketterson ............... H01L 23/66 |

* cited by examiner

SEMICONDUCTOR DEVICES AND METHODS OF MANUFACTURING THE SAME

BACKGROUND

In recent years, the semiconductor industry has experienced rapid growth due to continuous improvement in integration density of various electronic components, e.g., transistors, diodes, resistors, capacitors, etc. For the most part, this improvement in integration density has come from successive reductions in minimum feature size, which allows more components to be integrated into a given area.

These smaller electronic components also require smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), and package on package (PoP) devices. Some 3DICs are prepared by placing chips over chips on a semiconductor wafer level. The 3DICs provide improved integration density and other advantages, such as faster speeds and higher bandwidth, because of the decreased length of interconnects between the stacked chips. However, there are many challenges related to 3DICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
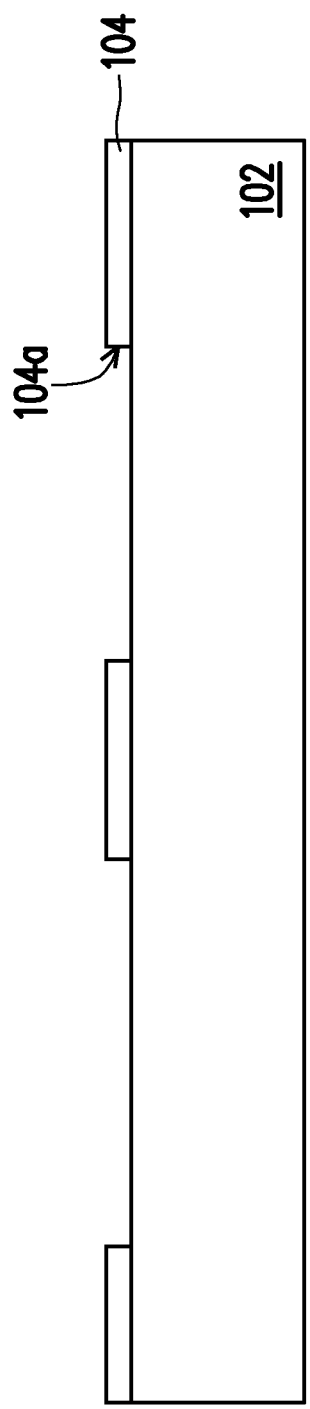
FIG. 1A to FIG. 1H are schematic cross-sectional views illustrating a method of manufacturing a bridge according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a method of manufacturing a bridge according to some embodiments of the disclosure.

Referring to FIG. 1A, a substrate 102 is provided. In some embodiments, the substrate 102 is a glass substrate, a ceramic substrate, a semiconductor substrate, or the like. In some embodiments, the substrate 102 is a silicon wafer or an active layer of a semiconductor-on-insulator (SOI) substrate, or the like. The substrate 102 may include a semiconductor material, such as doped or undoped silicon, or may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

Then, as shown in FIG. 1A to FIG. 1D, an interconnect structure 110 is formed over the substrate 102. The interconnect structure 110 may be formed using a damascene process. In detail, as shown in FIG. 1A, first, a dielectric material 104 is formed on the substrate 102. A material of the dielectric material 104 may include an oxide such as silicon oxide, phosphosilicate glass (PSG), borosilicate glass (BSG), boron-doped phosphosilicate glass (BPSG), a nitride such as silicon nitride, or the like. In some alternative embodiments, the dielectric material 104 includes low-k dielectrics having a smaller dielectric constant than silicon oxide, and examples of low-k dielectrics include organosilicate glasses (OSG) such as carbon-doped silicon dioxide and fluorine-doped silicon dioxide (otherwise referred to as fluorinated silica glass (FSG). In some alternative embodiments, the dielectric material 104 includes extremely low-k dielectrics having a dielectric constant of about 2.1 or less, and extremely low-k dielectrics are generally low-k dielectrics formed into a porous structure. Porosity reduces the effective dielectric constant. The dielectric material 104 may be formed any acceptable deposition process, such as spin coating, CVD, laminating, the like, or a combination thereof. Then, a plurality of openings 104a are formed in the dielectric material 104. The openings 104a may be formed by a photolithography process.

Figure 1B:
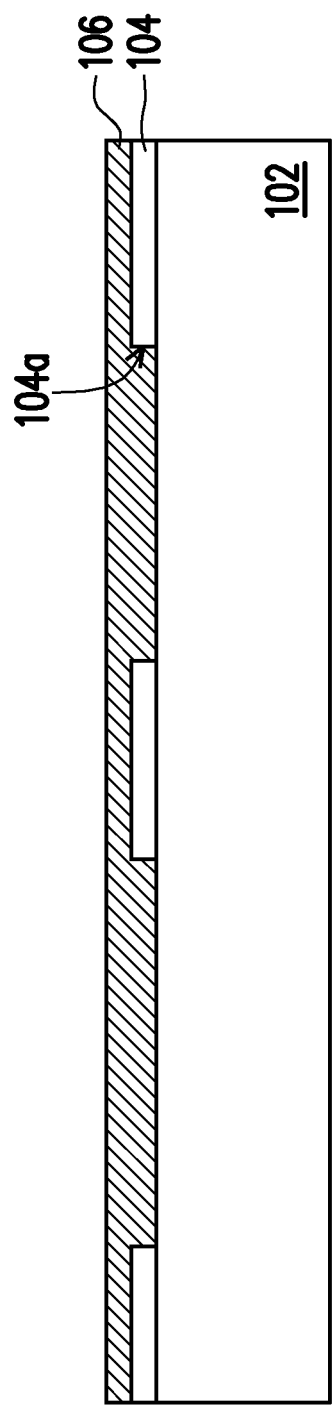

Referring to FIG. 1B, a conductive material 106 is formed on the dielectric material 104 and filled into the openings 104a. A material of the conductive material 106 may include copper, silver, gold, tungsten, aluminum, copper doped with aluminum or manganese, combinations thereof, or the like. The conductive material 106 may be formed by a plating process such as electro-plating, electroless-plating, immersion plating, or the like. In some alternative embodiments, an optional diffusion barrier layer and/or optional adhesion layer may be deposited before forming the conductive material 106. A material of the diffusion barrier layer may include titanium, titanium nitride, titanium oxide, tantalum, tantalum nitride, titanium oxide, or other alternatives, and suitable materials for the conductive material.

Figure 1C:
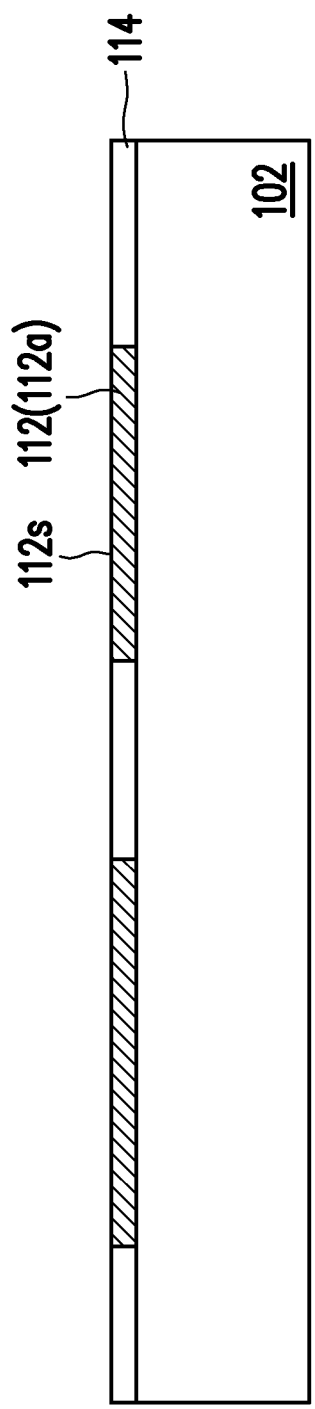

Referring to FIG. 1C, portions of the conductive material 106 outside the openings 104a are removed, so as to form a plurality of conductive features 112 in a dielectric layer 114. In some embodiments, a planarization process such as chemical mechanical planarization (CMP) process may be used to remove excess conductive material 106 from a surface of the dielectric material 104 and to planarize the surface for subsequent processing. Accordingly, the conductive features 112 may have smooth top surfaces 112s. In some embodiments, the formed conductive features 112 are conductive lines 112a formed by a damascene process.

Figure 1D:
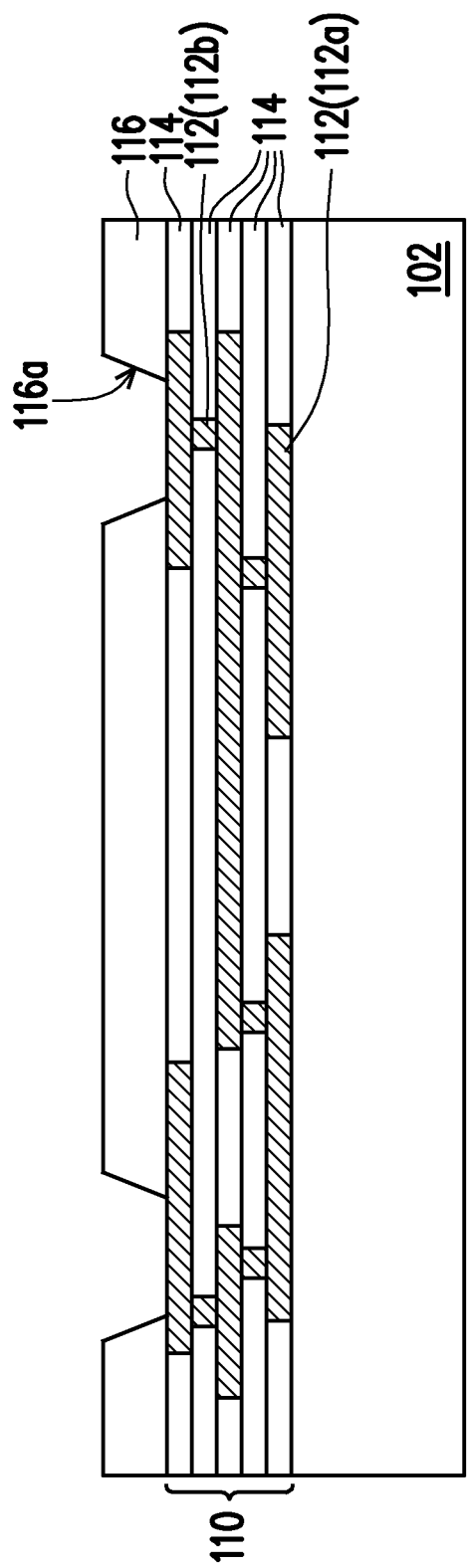

Referring to FIG. 1D, a plurality of conductive features 112 a plurality of dielectric layers 114 and are formed over the bottommost conductive features 112 in the bottommost dielectric layer 114, to form an interconnect structure 110. The conductive features 112 may be conductive lines 112a and/or conductive vias 112b. The conductive vias 112b may extend through the dielectric layer 114 to provide vertical connections between layers of conductive lines 112a. The conductive features 112 may be formed by using a damascene process as shown in FIG. 1A and FIG. 1C, that is, forming a dielectric material, forming a plurality of openings corresponding to the desired pattern of the conductive lines and/or the conductive vias, filling the openings with a conductive material and removing excess of the conductive material outside the openings. In some alternative embodiments, the conductive features 112 may be formed by a dual damascene process, in other words, the conductive lines 112a and the respective conductive vias 112b are formed integrally. In some alternative embodiments, the dielectric layer 114 has a single layered or a multiple layered structure.

In some embodiments, the interconnect structure 110 may include five layers of conductive features 112 and five layers of dielectric layers 114. In other embodiments, the interconnect structure 110 include a different number of layers of conductive features 112 and a different number of layers of dielectric layers 114. In some embodiments, a thickness of a layer of the conductive lines 112a is smaller than 1 µm. In some embodiments, the use of a damascene or dual damascene process forms the conductive features 112 having a smaller linewidth, which can increase the density of the conductive features 112. For example, the conductive features 112 may have a linewidth smaller than 1 µm.

In some embodiments, a passivation layer 116 is formed on the interconnect structure 110. The passivation layer 116 has a plurality of openings 116a to expose portions of the interconnect structure 110. The passivation layer 116 may include an oxide such as silicon oxide, a nitride such as silicon nitride, or the like. The passivation layer 116 may be formed any acceptable deposition process, such as spin coating, CVD, laminating, the like, or a combination thereof.

Figure 1E:
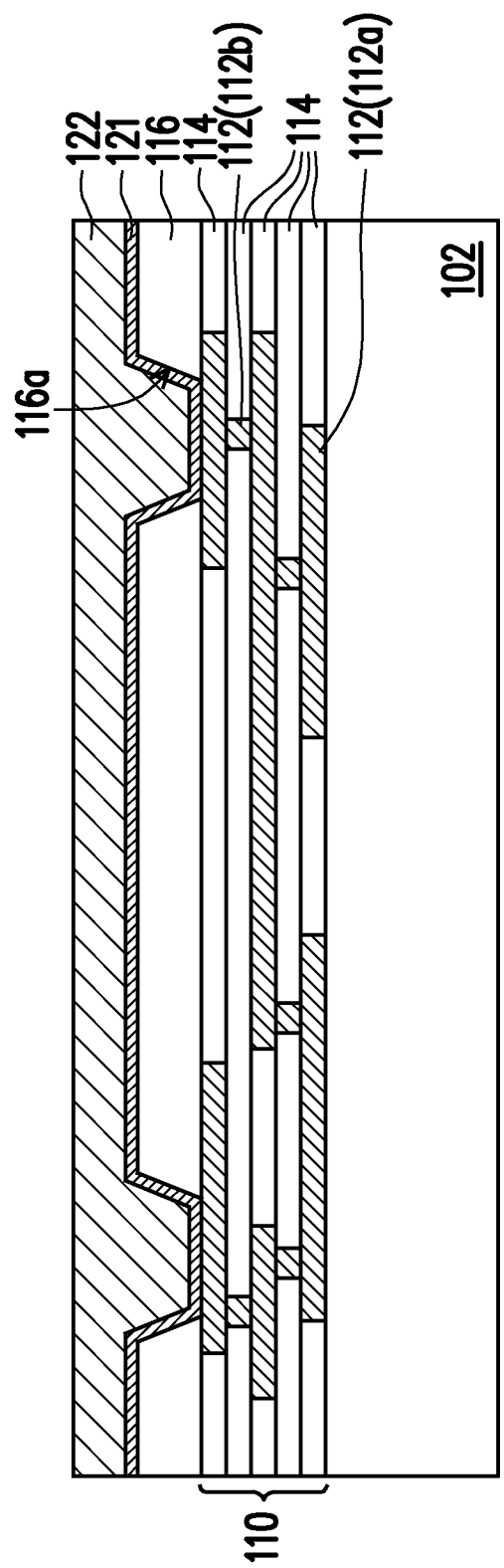
Figure 1F:
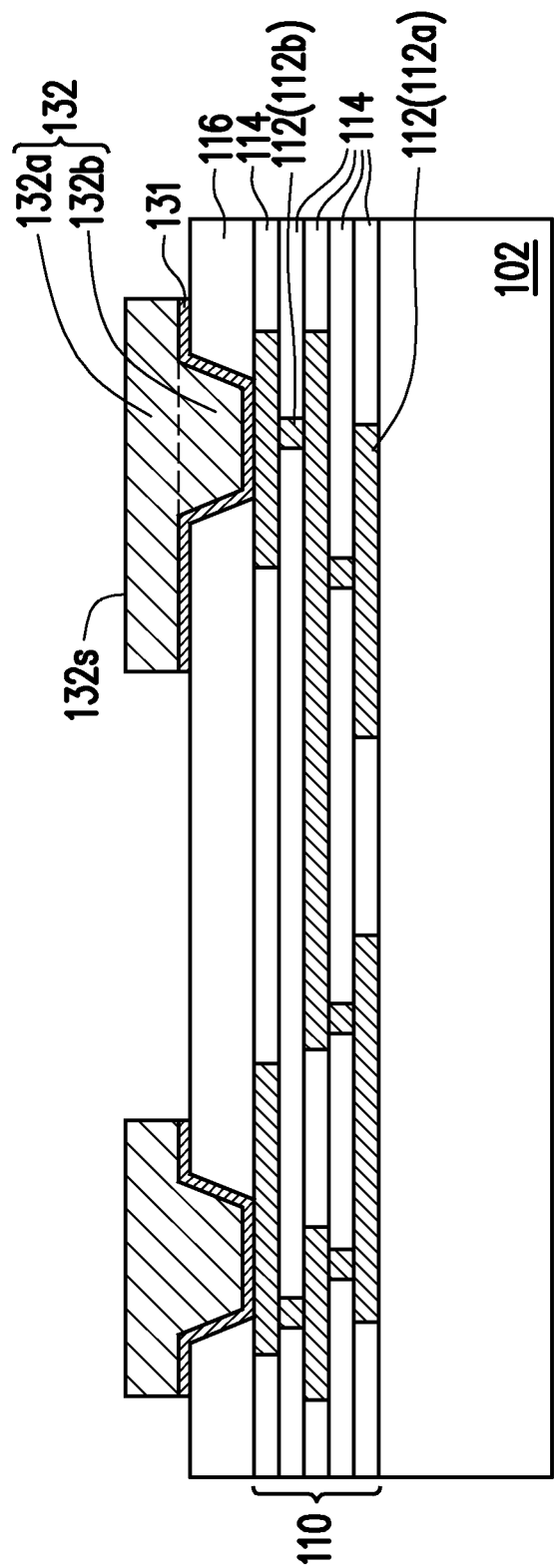
Figure 1G:
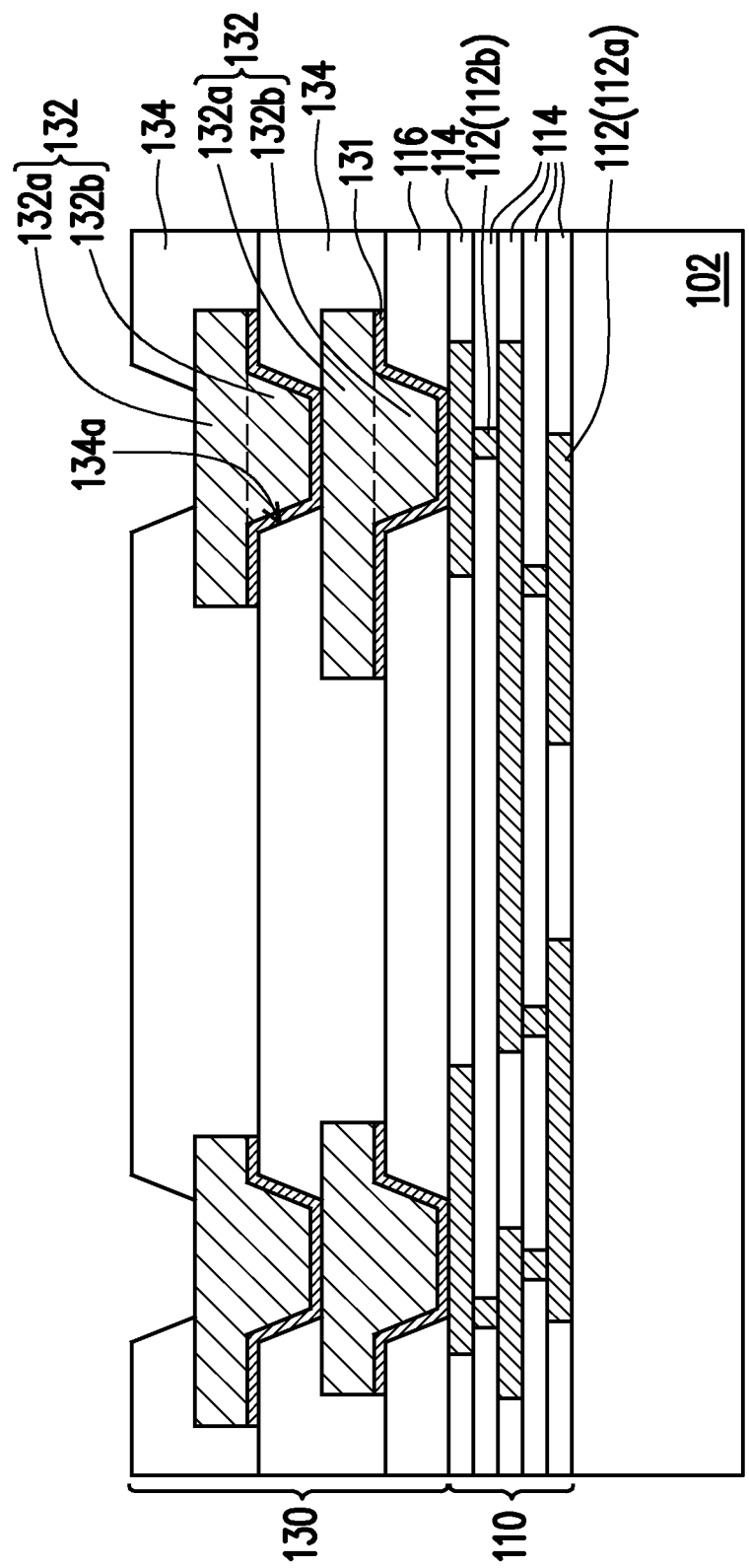

Referring to FIG. 1E to FIG. 1G, a redistribution layer (RDL) structure 130 is formed over the interconnect structure 110. The redistribution layer structure 130 may be formed using a photolithography process. In detail, first, as shown in FIG. 1E, a conductive material 122 is formed on the passivation layer 116 and filled into the openings 116a of the passivation layer 116. A material of the conductive material 122 may include copper, silver, gold, tungsten, aluminum, combinations thereof, or the like. The conductive material 122 is blanket deposited on the passivation layer 116 by sputtering, printing, electro plating, electroless plating or CVD, for example. In some embodiments, a diffusion barrier material 121 is formed between the conductive material 122 and the passivation layer 116. The diffusion barrier material 121 may include titanium, titanium nitride, titanium oxide, tantalum, tantalum nitride, titanium oxide, or other alternatives. The diffusion barrier material 121 is blanket deposited on the passivation layer 116, for example.

Referring to FIG. 1F, the conductive material 122 is patterned into a plurality of conductive features 132. In some embodiments, the conductive material 122 and the diffusion barrier material 121 thereunder are patterned simultaneously by using a mask (not shown), to form the conductive features 132. In some embodiments, the conductive features 132 are disposed on the passivation layer 116 and fills the openings 116a, so as to electrically connect to the conductive features 112 of the interconnect structure 110. In some embodiments, each of the conductive features 132 include a conductive line 132a and a conductive via 132b. A diffusion barrier layer 131 is disposed under a bottom surface of the conductive feature 132, for example. In some embodiments, a sidewall of the diffusion barrier layer 131 is substantially flush with a sidewall of the conductive feature 132. In some embodiments, since the conductive features 132 are formed by the photolithography process, the conductive features 132 may have rough top surfaces 132s. The roughness of the top surfaces 132s of the conductive features 132 may be larger than the roughness of the top surfaces 122s of the conductive features 122.

Referring to FIG. 1G, at least one polymer layer 134 and a plurality of conductive features 132 are formed over the bottommost conductive features 132, to form a RDL structure 130. The conductive features 132 may be formed by using a photolithography process, that is, forming the polymer layer 134 including a plurality of openings 134a to expose the conductive features 132, forming a conductive material over the polymer layer 134, and patterning the conductive material. A material of the polymer layer 134 may include organic materials such as polyimide, polybenzoxazole (PBO), benzocyclobutene (BCB), or the like. The polymer layers 134 may be formed by any acceptable deposition process, such as spin coating, CVD, laminating, the like, or a combination thereof. The material of the polymer layer 134 is different from the material of the dielectric layer 114. In some embodiments, the material of the polymer layer 134 is different from the material of the passivation layer 116. A material of the conductive material may include copper, silver, gold, tungsten, aluminum, combinations thereof, or the like. The conductive material is deposited on the polymer layer 134 by sputtering, printing, electro plating, electroless plating or CVD, for example. In some embodiments, the conductive line 132a and the conductive via 132b are integrally formed. However, the disclosure is not limited thereto. In some alternative embodiments, the conductive line 132a and the conductive via 132b are separately formed, and the conductive line 132a and the conductive via 132b are disposed in different polymer layers 134. In some alternative embodiments, the polymer layer 134 has a single layered or a multiple layered structure.

In some embodiments, the RDL structure 130 includes the conductive features 132 (sometimes referred to as redistribution layers or redistribution lines) in the polymer layers 134. The conductive features 132 may be conductive lines 132a or conductive vias 132b between the conductive lines 132a. The conductive vias 132b may extend through the polymer layer 134 to provide vertical connections between layers of conductive lines 132a. Some of the conductive vias 132b may extend through the passivation layer 116 to provide vertical connections between the RDL structure 130 and the interconnect structure 110. The RDL structure 130 may include four stacked layers of conductive features and two layers of polymer layers. In other embodiments, the RDL structure 130 includes a different number of layers of conductive features and a different number of layers of polymer layers. For example, the RDL structure 130 includes at least one layer of conductive feature and at least one layer of polymer layer. In some embodiments, a thickness of a layer of the conductive lines 132a is larger than 4 μm.

Figure 1H:
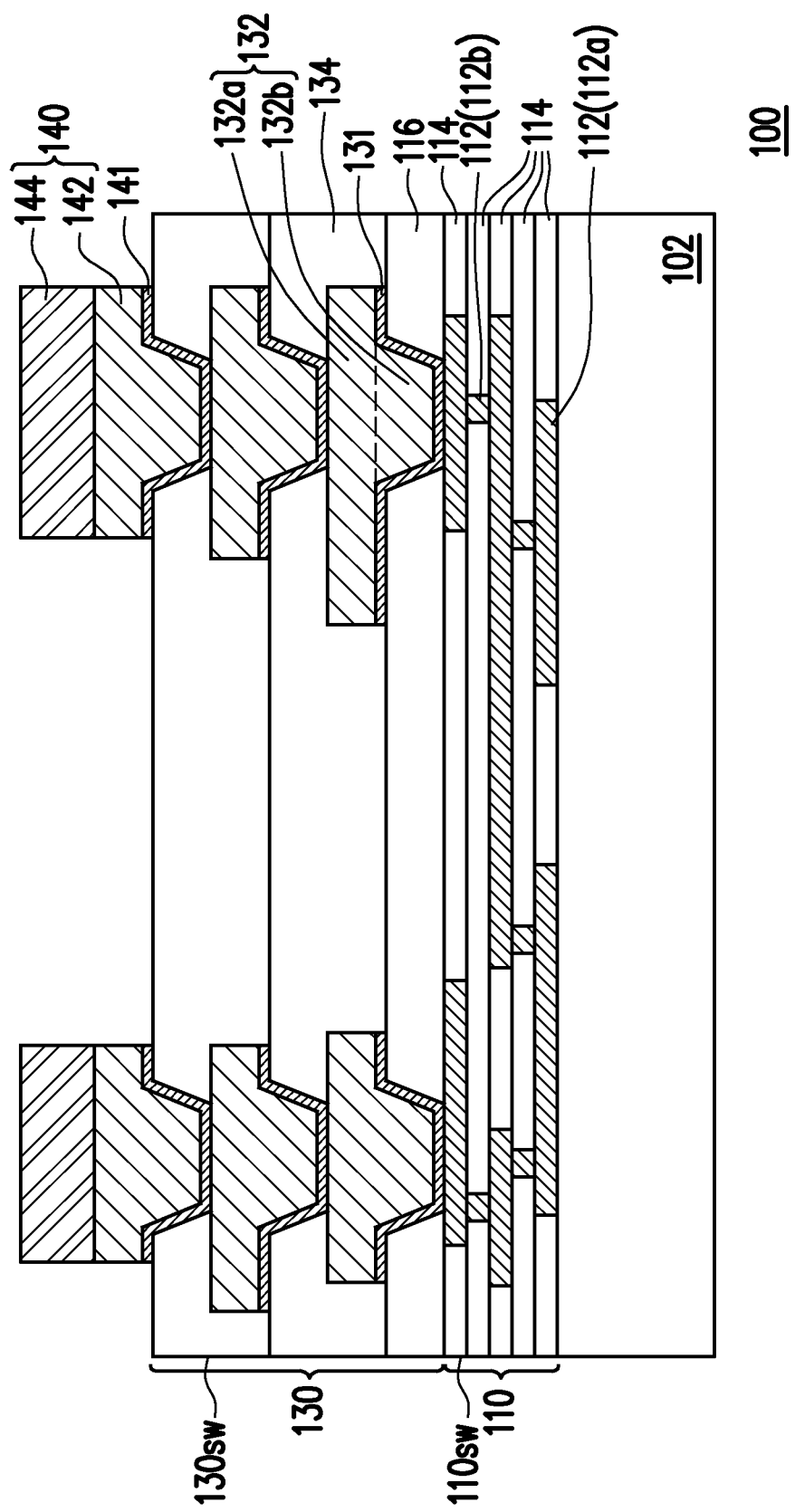

Referring to FIG. 1H, a plurality of conductive connectors 140 are formed over the RDL structure 130. Thus, a bridge 100 is completed. In some embodiments, the conductive connectors 140 are referred to as conductive terminals. In some embodiments, the conductive connectors 140 includes conductive pads or conductive pillars 142 with solder regions 144 disposed thereon. In some embodiments, the conductive pillars 142 may have substantially vertical sidewalls. In some alternative embodiments, the conductive pillars 142 may be omitted, and the solder regions 144 may be disposed directly on the conductive features 132 of the RDL structure 130. In some embodiments, the conductive pillars 142 may include a conductive material such as solder, copper, aluminum, gold, nickel, silver, palladium, tin, the like, or a combination thereof. In some embodiments, the conductive connectors 140 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 140 may be formed by a suitable process such as evaporation, plating, ball drop, screen printing, or a ball mounting process. In some embodiments, a diffusion barrier layer 141 is disposed under a bottom surface of the conductive pillar 142. A material of the diffusion barrier layer 141 may include titanium, titanium nitride, titanium oxide, tantalum, tantalum nitride, titanium oxide, or other alternatives. In some embodiments, the conductive connectors 140 are arranged along a periphery of the bridge 100. For example, the conductive connectors 140 are disposed at four sides of the bridge 100. In some alternative embodiments, the conductive connectors 140 are disposed at opposite sides of the bridge 100. In some embodiments, two conductive connectors 140 are disposed at one side of the bridge 100. However, the disclosure is not limited thereto. The bridge 100 may have any number of conductive connectors 140 at one side. In some alternative embodiments, multiple bridges are formed on a single substrate (i.e., the substrate 102) and singulated in to form individual bridge, such as the individual interconnect device 100 shown in FIG. 1H. In such embodiments, after forming the conductive connectors 140, a dicing process is performed.

The bridge 100 has the substrate 102, the interconnect structure 110, the RDL structure 130 and the conductive connectors 140. In some embodiments, the bridge 100 is free of active devices. For example, the bridge 100 may be free of transistors, diodes, and/or the like. Further, the bridge 100 may be also be free of passive devices such as capacitors, resistors, inductors, and/or the like. The RDL structure 130 is disposed between the interconnect structure 110 and the conductive connectors 140. The conductive connectors 140 are electrically connected to each other through the interconnect structure 110 and the RDL structure 130. In some embodiments, a sidewall 110sw of the interconnect structure 110 (i.e., sidewalls of the dielectric layers 114) is substantially flush with a sidewall 130sw of the RDL structure 130 (i.e., sidewalls of the polymer layers 134). The bridge 100 provides electrical connection between devices directly bonded to the conductive connectors 140 such as between devices dies (for example, a logic die and a memory die). In embodiments where the substrate 102 includes silicon, the bridge 100 is also referred to as a silicon bus or a silicon bridge.

Figure 2A:
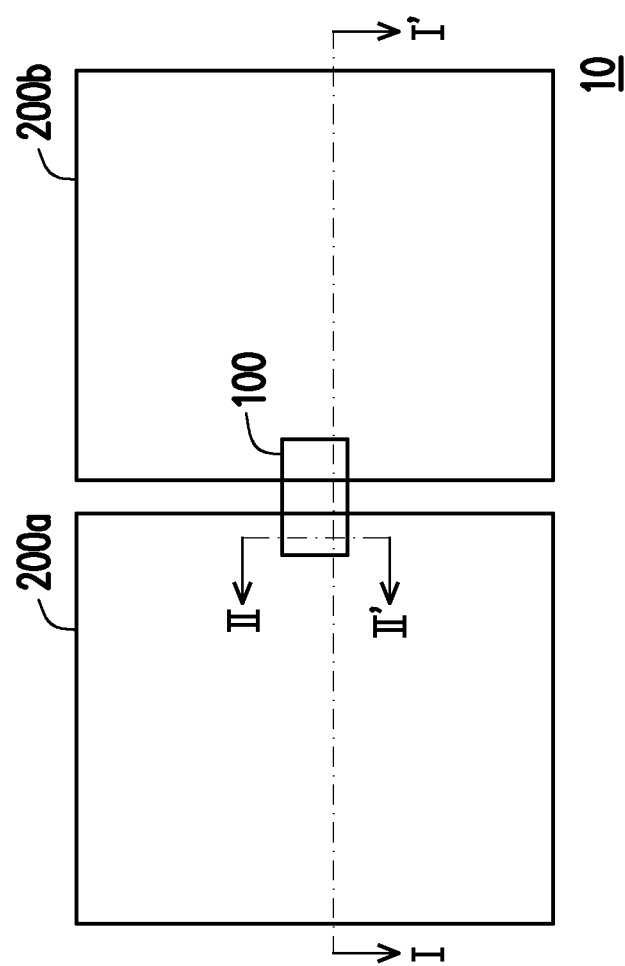
FIG. 2A is a top view of a semiconductor device according to some embodiments of the disclosure.
Figure 2B:
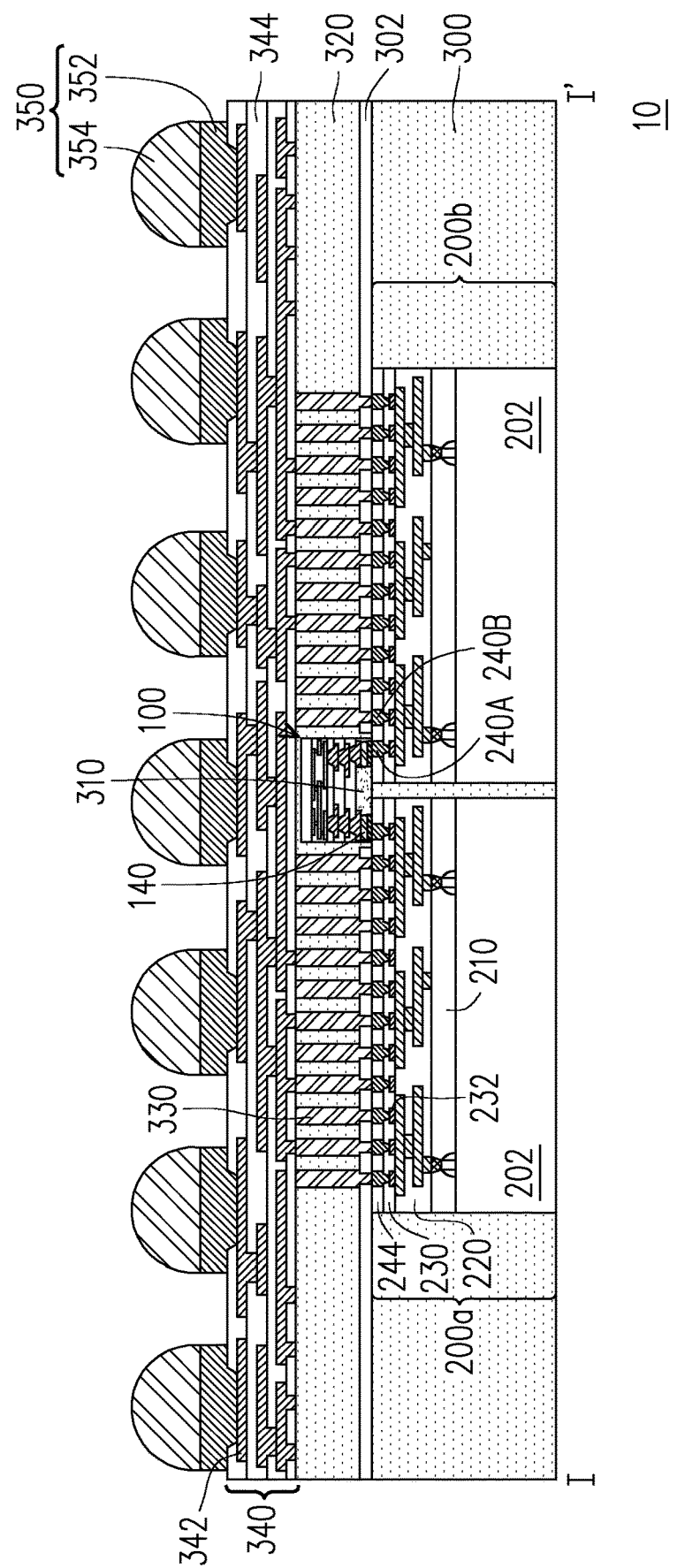
FIG. 2B is a schematic cross-sectional view taken along line I-I' of FIG. 2A.
Figure 2C:
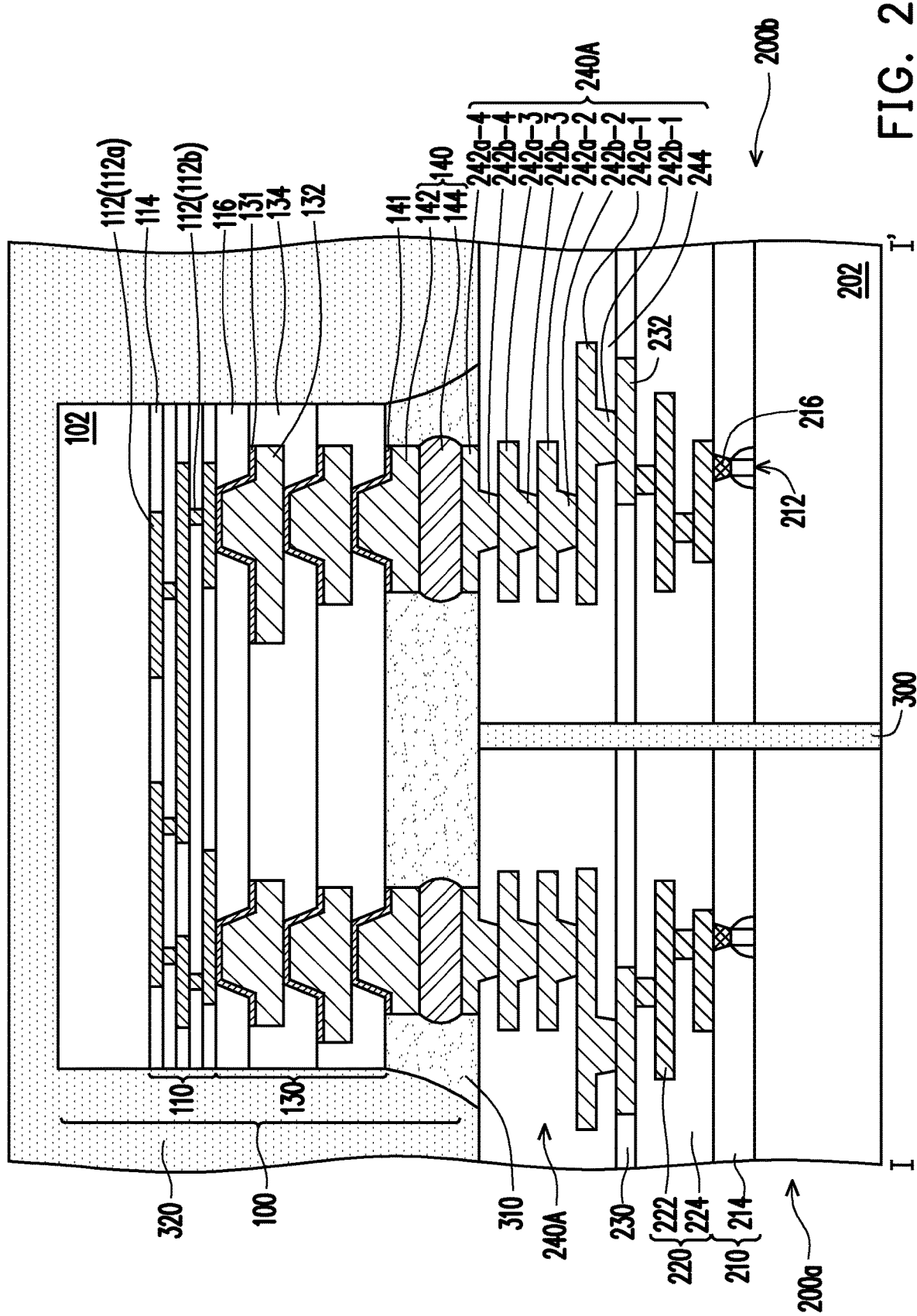
FIG. 2C is an enlarged view of a portion of the structure showing in FIG. 2B.
Figure 2D:
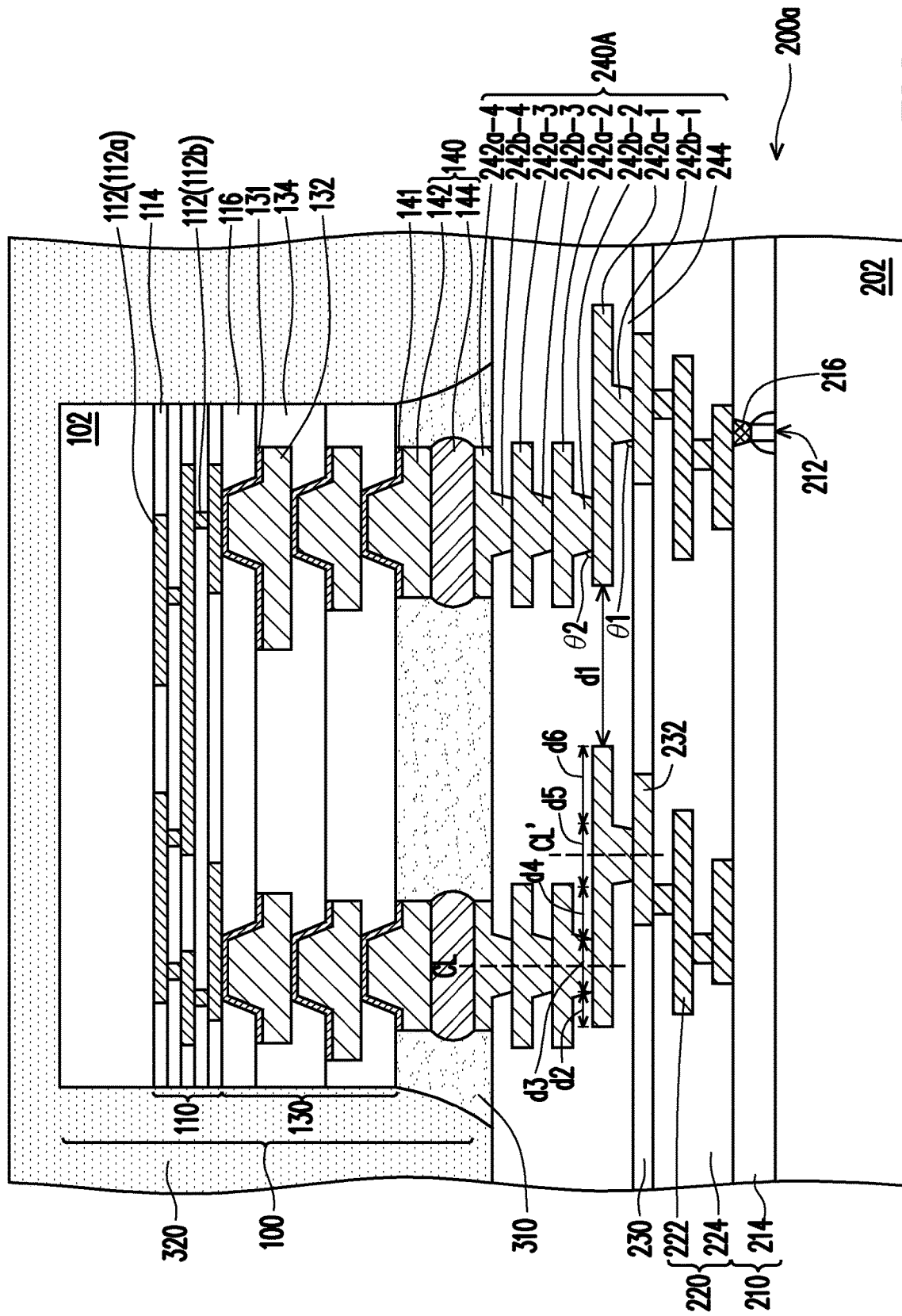
FIG. 2D is a schematic cross-sectional view taken along line II-II' of FIG. 2A.

FIG. 2A is a top view of a semiconductor device according to some embodiments of the disclosure, FIG. 2B is a schematic cross-sectional view taken along line I-I' of FIG. 2A, FIG. 2C is an enlarged view of a portion of the structure showing in FIG. 2B, and FIG. 2D is a schematic cross-sectional view taken along line II-II' of FIG. 2A. For clarity, details of bridge and integrated circuits are omitted in FIG. 2B.

Referring to FIG. 2A to FIG. 2D, a semiconductor device 10 includes a plurality of integrated circuits 200 and a bridge 100 electrically connecting the integrated circuits 200. In some embodiments, the bridge 100 has a structure the same as or similar to the bridge 100 of FIG. 1H. In some embodiments, the integrated circuits 200 are disposed side by side and encapsulates by an encapsulant 300. The integrated circuits 200 may be of different types or the same type. For example, the integrated circuit 200 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), the like, a multi-functional die, or combinations thereof. The integrated circuits 200 have similar structures. In some embodiments, widths and lengths of the integrated circuits 200 are different, and heights of the integrated circuits 200 are substantially the same. In some alternative embodiments, widths, lengths and/or heights of the integrated circuits 200 are substantially the same or different.

Referring to FIG. 2C and FIG. 2D, in some embodiments, the integrated circuit 200 includes a substrate 202, a device layer 210 in and/or on the substrate 202, an interconnect structure 220 over the device layer 210, a passivation layer 230 over the interconnect structure 220, a plurality of conductive pads 232 in the passivation layer 230 and a plurality of conductive connectors 240A, 240B in a dielectric layer 244 over the conductive pads 232. In some embodiments, the substrate 202 is similar to the substrate 102. The device layer 210 is disposed on a top surface of the substrate 202 or partially disposed in the substrate 202. The device layer 210 includes at least one device 212 in a dielectric layer 214, for example. The device 212 may be active devices such as transistors. The device 212 is electrically connected to the interconnect structure 220 through a via 216. The interconnect structure 220 may include a plurality of conductive features 222 in a dielectric layer 224 to provide circuit structure. The conductive features 222 may include a plurality of conductive lines and a plurality of conductive vias interconnecting the conductive lines. The conductive pads 232 are electrically connected to the interconnect structure 220. The conductive connectors 240A, 240B are electrically connected to the conductive pads 232 respectively.

Referring to FIG. 2B to FIG. 2D, in some embodiments, sidewalls of the integrated circuits 200 are encapsulated by the encapsulant 300, and a portion of the encapsulant 300 fills a gap between the integrated circuits 200. In some embodiments, the encapsulant 300 includes a molding compound, a molding underfill, a resin such as epoxy, a combination thereof, or the like. In some other embodiments, the encapsulant 300 includes a photo-sensitive material such as polybenzoxazole (PBO), polyimide, benzocyclobutene (BCB), a combination thereof, or the like, which may be easily patterned by exposure and development processes or laser drilling process. In some alternative embodiments, the encapsulant 300 includes nitride such as silicon nitride, oxide such as silicon oxide, phosphosilicate glass (PSG), borosilicate glass (BSG), boron-doped phosphosilicate glass (BPSG), a combination thereof, or the like. In some embodiments, the encapsulant 300 is formed by forming an encapsulant material by a suitable fabrication technique such as spin-coating, lamination, deposition, or similar processes. The encapsulant material encapsulates top surfaces and sidewalls of the integrated circuits 200 and fills the gap between the integrated circuits 200. Thereafter, a grinding or polishing process is performed to remove a portion of the encapsulant material, such that the top surfaces of the integrated circuits 200 are exposed. In some embodiments, the top surfaces of the integrated circuits 200 and the top surface of the encapsulant 300 are substantially coplanar. In some alternative embodiments, a dielectric layer 302 is formed on the integrated circuits 200 and the encapsulant 300. The dielectric layer 302 includes a plurality of openings to expose the conductive connectors 240A, 240B of the integrated circuits 200.

The bridge 100 is bonded to the integrated circuits 200 through the conductive connectors 140. For example, the solder regions 144 of the conductive connector 140 are bonded to the conductive connectors 240A of the integrated circuits 200 using a flip chip bonding process. A reflow process may be applied to adhere the solder regions 144 of the conductive connectors 140 to the conductive connectors 240A. In some embodiments, after the reflow process, the solder region 144 of the conductive connector 140 is rounded. Conventionally, during the joint process of the bridge and the integrated circuits under a temperature change from a low temperature such as 100° C. to a high temperature such as 300° C., the warpage profile of the bridge (there is no RDL structure in conventional bridge), the warpage profile of the bridge remains "smiling" (concave) warpage profile. On contrary, in some embodiments, since the bridge 100 is configured to have the RDL structure 130 including polymer material, the warpage profile of the bridge 100 changes from a "crying" (convex) warpage profile to a "smiling" (concave) warpage profile during the joint process of the bridge 100 and the integrated circuits 200 under a temperature change from a low temperature such as 100° C. to a high temperature such as 300° C. Thus, the joint window may be improved.

In some embodiments, after the reflow process, an underfill layer 310 is formed to fill the space between the bridge 100 and the integrated circuits 200. The underfill layer 310 covers a first surface (i.e., a surface facing the integrated circuits 200) of the bridge 100, sidewalls of the conductive connectors 140, a surface of the dielectric layer 244 and sidewalls of the conductive connectors 240A. In some alternative embodiments, the underfill layer 310 further extends upward to cover a portion of a sidewall of the bridge 100. In some embodiments, the underfill layer 310 may be a polymer such as epoxy.

In some embodiments, after forming the underfill layer 310, an encapsulant 320 is formed over the integrated circuits 200 to encapsulate the sidewall of the bridge 100 and a sidewall of the underfill layer 310. The encapsulant 320 is disposed over the integrated circuits 200 and the encapsulant 300. In some embodiments, a second surface opposite to the first surface of the bridge 100 is covered by the encapsulant 320. In some alternative embodiments, the second surface of the bridge 100 is coplanar with a surface of the encapsulant 320. In some embodiments, an outer sidewall of the encapsulant 320 is substantially flush with an outer sidewall of the encapsulant 300. In some embodiments, the forming method and the material of the encapsulant 320 are similar to those of the encapsulant 300.

In some embodiments, a plurality of through integrated fan-out vias (TIVs) 330 are formed in the encapsulant 320 to electrically connect to the integrated circuits 200. In some embodiments, the TIVs 330 penetrate the encapsulant 320 and the dielectric layer 302. The TIVs 330 may be in electrical contact with the conductive connectors 240B (which are not bonded to the bridge 100) of the integrated circuits 200. The TIVs 330 may surrounds the bridge 100. The TIVs 330 include conductive materials such as copper, nickel, solder, alloys thereof, or the like, or a combination thereof. The TIVs 330 are formed by, electroplating, for example.

In some embodiments, after forming the encapsulant 320 and the TIVs 330, a RDL structure 340 is formed over the encapsulant 320, the TIVs 330 and the bridge 100. The RDL structure 340 is electrically connected to the TIVs 330, such that the two integrated circuits 200 are electrically connected through the TIVs 330 and the RDL structure 340. In some embodiments, the RDL structure 340 includes a plurality of conductive features 342 and a plurality of polymer layers 344. The conductive features 342 are stacked alternately in the polymer layers 344. In some embodiments, the forming method and the material of the RDL structure 340 are similar to those of the RDL structure 130. In some embodiments, an outer sidewall of the RDL structure 340 are substantially flush with the outer sidewall of the encapsulant 300 and the outer sidewall of the encapsulant 320.

In some embodiments, a plurality of conductive connectors 350 are formed over the RDL structure 340. In some embodiments, the conductive connectors 350 are referred to as conductive terminals. The conductive connectors 350 may include conductive pads or conductive pillars 352 with solder regions 354 disposed thereon. In some embodiments, the conductive connectors 350 are similar to the conductive connectors 140. In some embodiments, a diameter of the conductive connectors 350 is larger than a diameter of the conductive connectors 140. The conductive connectors 350 are electrically connected to the two integrated circuits 200 through the RDL structure 340 and the TIVs 330. In some embodiments, the two integrated circuits 200 are electrically connected through the bridge 100, the TIVs 330 and the RDL structure 340. In some alternative embodiment, the semiconductor device 10 is placed on a package structure such as an integrated circuit (IC) device to form a PoP device. The PoP device may be further connected to other package components such as a printed circuit board (PCB), a flex PCB, or the like.

In some embodiments, as shown in FIG. 2C and FIG. 2D, the conductive connector 240A include a plurality of conductive pads 242a-1, 242a-2, 242a-3, 242a-4 and a plurality of conductive vias 242b-1, 242b-2, 242b-3, 242b-4 stacked on one another. The conductive vias 242b-1, 242b-2, 242b-3, 242b-4 are disposed between the conductive pads 232, 242a-1, 242a-2, 242a-3, 242a-4. The conductive pad 242a-1, 242a-2, 242a-3, 242a-4 and the respective conductive via 242b-1, 242b-2, 242b-3, 242b-4 may be integrally formed. In some alternative embodiments, the conductive pad 242a-1, 242a-2, 242a-3, 242a-4 and the respective conductive via 242b-1, 242b-2, 242b-3, 242b-4 are separated formed. In some embodiments, the conductive via 242b-1 is directly connected to the conductive pad 232 in the passivation layer 230. In some embodiments, the integrated circuits 200 are each directly bonded to the conductive connectors 140. That is, the conductive pad 242a-4 may be directly bonded to the conductive connector 140 of the bridge 100. For example, the conductive pads 242a-4 are in direct contact with the solder regions 144 of the conductive connector 140.

In some embodiments, at the location directly below the conductive connectors 140 of the bridge 100, the conductive vias 242b-1, 242b-2, 242b-3, 242b-4 of the conductive connectors 240A are stacked sequentially over the substrate 202. That is, a distance (i.e., a vertical distance) between the conductive via 242b-1 and the conductive connector 140 of the bridge 100 is larger than a distance between the conductive via 242b-2, 242b-3, 242b-4 and the conductive connector 140 of the bridge 100. In some embodiments, the conductive vias 242b-2, 242b-3, 242b-4 are substantially aligned with one another while the conductive via 242b-1 is misaligned with the conductive vias 242b-2, 242b-3, 242b-4. For example, central lines CL of the conductive vias 242b-2, 242b-3, 242b-4 are substantially aligned, and a central line CL' of the conductive via 242b-1 is not separated from and not aligned with the central lines CL of the conductive vias 242b-2, 242b-3, 242b-4. In some embodiments, the conductive vias 242b-2, 242b-3, 242b-4 are partially overlapped in a vertical direction, and the conductive via 242b-1 is not overlapped with the conductive vias 242b-2, 242b-3, 242b-4 in the vertical direction. That is, the conductive via 242b-1 is not directly stacked with the conductive vias 242b-2, 242b-3, 242b-4. In some embodiments, stacking conductive vias 242b-2, 242b-3, 242b-4 prevent cracks in the fine pitch structure, and the conductive via 242b-1 misaligned with the stacking conductive vias 242b-2, 242b-3, 242b-4 prevents high stress induced void. In an embodiment, compared to the configuration of the conductive vias 242b-1, 242b-2, 242b-3, 242b-4 being aligned with one another, the configuration of the conductive vias 242b-1, 242b-2, 242b-3, 242b-4 of FIG. 2C and FIG. 2D prevents the crack. For example, the occurrence of the crack is reduced to about 0% from about 38%. In some alternative embodiments, the conductive via 242b-1, 242b-2, 242b-3 are substantially aligned with one another while the conductive via 242b-4 is misaligned with them.

In an embodiment, a material of the dielectric layer 244 surrounding the conductive via 242b-1 is epoxy. The critical dimension of the conductive via 242b-1, 242b-2 may be smaller than the critical dimension of the conductive via 242b-3, 242b-4. In an embodiment, the critical dimension of the conductive via 242b-1 is substantially the same as the critical dimension of the conductive via 242b-2. In an embodiment, the conductive via 242b-3 is large than the critical dimension of the conductive via 242b-1, 242b-2, 242b-4. In some embodiments, the conductive connectors 240A of the integrated circuits 200 directly bonded to the bridge 100 have the configuration of FIG. 2C and FIG. 2D. However, the disclosure is not limited thereto. In some alternative embodiments, the conductive connector 240A has other suitable configuration.

Conventionally, the bridge (i.e., bridge die) is fabricated merely by using damascene process. On contrary, in some embodiments, the bridge is fabricated by using both damascene process and RDL process. In other words, the bridge is configured to have the RDL structure including polymer material. Accordingly, the warpage profile of the bridge changes from a "crying" (convex) warpage profile to a "smiling" (concave) warpage profile during the joint process of the bridge and the integrated circuits under a temperature change from a low temperature to a high temperature. Thus, the joint window may be improved. Additionally, in some embodiments, by stacking conductive vias in a specific arrangement, cracks in the fine pitch structure and high stress induced void are prevented.

In accordance with some embodiments of the disclosure, a semiconductor device includes a bridge and a plurality of dies. The bridge is free of active devices and includes a substrate, an interconnect structure, a RDL structure and a plurality of conductive connectors. The interconnect structure includes at least one dielectric layer and a plurality of first conductive features in the at least one dielectric layer. The RDL structure includes at least one polymer layer and a plurality of second conductive features in the at least one polymer layer, wherein a sidewall of the interconnect structure is substantially flush with a sidewall of the RDL structure. The conductive connectors are electrically connected to one another by the RDL structure and the interconnect structure. The bridge electrically connects the plurality of dies.

In accordance with some embodiments of the disclosure, a semiconductor device includes a bridge, a first integrated circuit and a second integrated circuit. The bridge is free of active devices includes a semiconductor substrate, an interconnect structure, a RDL structure and a plurality of first conductive connectors. The RDL structure is disposed between the interconnect structure and the plurality of first conductive connectors. The first integrated circuit and the second integrated circuit are electrically connected by the bridge. The first integrated circuit includes a second conductive connector directly bonded to one of the first conductive connectors. The second conductive connector includes a plurality of conductive pads and a plurality of conductive vias between the plurality of conductive pads. One of the plurality of conductive vias is not overlapped with others of the plurality of the conductive vias while the others of the plurality of the conductive vias are overlapped with one another.

In accordance with some embodiments of the disclosure, a method of manufacturing a semiconductor device includes forming a bridge free of active devices, and bonding the bridge onto a first integrated circuit and a second integrated circuit to electrically connect a first integrated circuit and a second integrated circuit. A forming method of the bridge includes the following steps. A plurality of first conductive features are formed in a plurality of dielectric layers on a substrate by a damascene process, to form an interconnect structure. A plurality of second conductive features are formed in at least one polymer layer on the plurality of dielectric layers by a lithography process, to form a RDL structure over the interconnect structure. A plurality of conductive connectors are formed to electrically connect to the plurality of second conductive features.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a bridge free of active devices, comprising:
        a silicon semiconductor substrate;
        an interconnect structure, comprising at least one dielectric layer and a plurality of first conductive features in the at least one dielectric layer;
        a redistribution layer structure, comprising at least one polymer layer and a plurality of second conductive features in the at least one polymer layer, wherein a sidewall of the interconnect structure is substantially flush with a sidewall of the redistribution layer structure; and
        a plurality of conductive connectors, electrically connected to one another by the redistribution layer structure and the interconnect structure; and
    a plurality of dies, wherein the bridge electrically connects the plurality of dies.

2. The semiconductor device according to claim 1, wherein a material of the at least one dielectric layer is different from a material of the at least one polymer layer.

3. The semiconductor device according to claim 1, wherein a material of the at least one polymer layer comprise polyimide, polybenzoxazole (PBO), benzocyclobutene (BCB) or a combination thereof.

4. The semiconductor device according to claim 1, wherein a roughness of a top surface of each of the plurality of second conductive features is larger than a roughness of a top surface of each of the plurality of first conductive features.

5. The semiconductor device according to claim 1, wherein the plurality of dies are each directly bonded to the plurality of conductive connectors.

6. The semiconductor device according to claim 1, wherein the at least one dielectric layer is in direct contact with the silicon semiconductor substrate.

7. A semiconductor device, comprising:
    a bridge free of active devices, comprising:
        a semiconductor substrate;
        an interconnect structure;
        a redistribution layer structure; and
        first and second conductive connectors, wherein the redistribution layer structure is disposed between the interconnect structure and the first and second conductive connectors;
    a first integrated circuit and a second integrated circuit electrically connected by the bridge, the first integrated circuit comprises a third conductive connector directly bonded to the first conductive connector, the third conductive connector comprises a plurality of conductive pads and a plurality of first conductive vias and a second conductive via between the plurality of conductive pads, and the second conductive via is not overlapped with the first conductive vias while the first conductive vias are overlapped with one another;
    a first encapsulant encapsulating the first integrated circuit and the second integrated circuit;
    a second encapsulant encapsulating bridge; and
    a redistribution layer structure over the first encapsulant and the second encapsulant, wherein a sidewall of the redistribution layer structure is substantially flush with sidewalls of the first encapsulant and the second encapsulant.

8. The semiconductor device according to claim 7, wherein a vertical distance between the second conductive via and the first conductive connector is larger than a vertical distance between each of the first conductive vias and the first conductive connector.

9. The semiconductor device according to claim 7 further comprising an underfill layer surrounding the first and second conductive connectors and the third conductive connector and encapsulated by the second encapsulant.

10. The semiconductor device according to claim 7 further comprising a plurality of through vias surrounding the bridge in the second encapsulant and electrically connected to the redistribution layer structure, wherein first surfaces of the through vias are substantially coplanar with a surface of the second encapsulant, and second surfaces opposite to the first surfaces of the through vias are substantially coplanar with a surface of the bridge.

11. The semiconductor device according to claim 7, wherein first surfaces of the first and second integrated circuits are substantially flush with a first surface of the first encapsulant, and second surfaces opposite to the first surfaces of the first and second integrated circuits are substantially flush with a second surface opposite to the first surface of the first encapsulant.

12. The semiconductor device according to claim 7, wherein the second integrated circuit comprises a fourth conductive connector directly bonded to the second conductive connector, the fourth conductive connector comprises a plurality of third conductive vias overlapped with one another and a fourth conductive via not overlapped with the third conductive vias, and the first conductive vias and the third conductive vias are disposed between the second conductive via and the fourth conductive via in a horizontal direction.

13. The semiconductor device according to claim 12, wherein a vertical distance between the second conductive via and the first conductive connector is larger than a vertical distance between each of the first conductive vias and the first conductive connector, and a vertical distance between the fourth conductive via and the second conductive connector is larger than a vertical distance between each of the third conductive vias and the another of the second conductive connector.

14. The semiconductor device according to claim 7, wherein the first integrated circuit further comprises a fourth conductive connector directly bonded to the second conductive connector, the fourth conductive connector comprises a plurality of third conductive vias overlapped with one another and a fourth conductive via not overlapped with the third conductive vias, the second conductive via is disposed between the first conductive vias and the third conductive vias in a horizontal direction, and the third conductive vias are disposed between the second conductive via and the fourth conductive via in the horizontal direction.

* * * * *